(12) United States Patent
Yoshida et al.

(10) Patent No.: US 6,996,149 B2
(45) Date of Patent: Feb. 7, 2006

(54) SEMICONDUCTOR LASER DEVICE AND SEMICONDUCTOR LASER MODULE

(75) Inventors: Junji Yoshida, Tokyo (JP); Naoki Tsukiji, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 211 days.

(21) Appl. No.: 10/367,884

(22) Filed: Feb. 19, 2003

(65) Prior Publication Data

US 2004/0086017 A1    May 6, 2004

(30) Foreign Application Priority Data

Feb. 19, 2002    (JP)    ............... 2002-042239

(51) Int. Cl.
*H01S 5/00*    (2006.01)
(52) U.S. Cl. .................. 372/45.01; 372/46.01
(58) Field of Classification Search ........... 372/45–50, 372/45.01, 46.01
See application file for complete search history.

(56) References Cited

U.S. PATENT DOCUMENTS

| | | | | |
|---|---|---|---|---|
| 4,805,179 A | * | 2/1989 | Harder et al. | 372/46.011 |
| 4,907,239 A | * | 3/1990 | Hayakawa et al. | 372/46 |
| 4,961,197 A | * | 10/1990 | Tanaka et al. | 372/45.01 |
| 5,102,825 A | * | 4/1992 | Brennan et al. | 438/36 |
| 5,173,192 A | * | 12/1992 | Shalev | 210/767 |
| 5,568,501 A | * | 10/1996 | Otsuka et al. | 372/46 |
| 5,619,518 A | * | 4/1997 | Horie et al. | 372/46 |
| 5,856,207 A | * | 1/1999 | Otsuka et al. | 438/41 |
| 5,914,496 A | * | 6/1999 | Thijs et al. | 257/14 |
| 5,920,079 A | * | 7/1999 | Shimizu et al. | 257/18 |
| 6,110,756 A | * | 8/2000 | Otsuka et al. | 438/41 |
| 6,432,735 B1 | | 8/2002 | Cho et al. | |
| 6,614,821 B1 | * | 9/2003 | Jikutani et al. | 372/43.01 |
| 6,614,822 B2 | * | 9/2003 | Yoshida et al. | 372/45 |
| 6,707,836 B2 | * | 3/2004 | Orita et al. | 372/50 |
| 6,768,759 B2 | * | 7/2004 | Honkawa et al. | 372/46 |

FOREIGN PATENT DOCUMENTS

JP    8-330671    12/1996

* cited by examiner

*Primary Examiner*—Minsun Harvey
*Assistant Examiner*—Phillip Nguyen
(74) *Attorney, Agent, or Firm*—Oblon, Spivak, McClelland, Maier & Neustadt, P.C.

(57) ABSTRACT

In a semiconductor laser device having a GRIN-SCH-MQW structure, attention is paid to correlation among a lasing wavelength, a refractive index difference between an equivalent refractive index in a region including an active layer and an equivalent refractive index in a region including current blocking layers, and a composition of a barrier layer having a quantum well structure. By finding out an optimum combination of these three parameters, a width of the active layer is made wider than a conventional width, thus preventing occurrence of a kink due to horizontal transverse mode in the active layer.

11 Claims, 13 Drawing Sheets

| BARRIER COMPOSITION WAVELENGTH 1.2 μm | | BARRIER COMPOSITION WAVELENGTH 1.15 μm | |
| --- | --- | --- | --- |
| LASING WAVELENGTH (nm) | MAXIMUM OPTICAL OUTPUT (mW) | LASING WAVELENGTH (nm) | MAXIMUM OPTICAL OUTPUT (mW) |
| 1418.9 | 365.4 | 1371.6 | 385.2 |
| 1443.5 | 381.6 | 1389.6 | 386.5 |
| 1453.1 | 374.4 | 1407.6 | 386.7 |
| 1471.7 | 368.1 | 1418.25 | 379.5 |
| 1482 | 361.2 | 1426.6 | 378.1 |
| 1494.1 | 359.6 | 1435 | 377.1 |
| 1514 | 339.98 | 1455.4 | 369.3 |
| 1526.15 | 327 | 1483.4 | 340.6 |

FIG.6

| | BARRIER COMPOSITION WAVELENGTH (μm) X | | APPROXIMATE EXPRESSION (SHORT WAVELENGTH SIDE) | y | BARRIER COMPOSITION WAVELENGTH (μm) X | | APPROXIMATE EXPRESSION (LONG WAVELENGTH SIDE) |
|---|---|---|---|---|---|---|---|
| y | 1.15 | 1.20 | | | 1.20 | 1.15 | |
| Pmax=374.8mW | 1416.24 | 1447.42 | y = 623.5x + 699.22 | Pmax=374.8mW | 1447.73 | 1478.91 | y = -623.5x + 2195.9 |
| 370mW | 1410.41 | 1422.94 | y = 250.54x + 1122.3 | 370mW | 1472.21 | 1484.74 | y = -250.54x + 1772.9 |
| 360mW | 1400.48 | 1404.25 | y = 75.294x + 1313.9 | 360mW | 1490.90 | 1494.67 | y = -75.294x + 1581.3 |
| 350mW | 1392.32 | 1391.48 | y = -16.784x + 1411.6 | 350mW | 1503.67 | 1502.84 | y = 16.784x + 1483.5 |
| 340mW | 1385.21 | 1381.11 | y = -81.859x + 1479.3 | 340mW | 1514.04 | 1509.94 | y = 81.859x + 1415.8 |
| 330mW | 1378.83 | 1372.16 | y = -133.34x + 1532.2 | 330mW | 1522.99 | 1516.32 | y = 133.34x + 1363 |
| 320mW | 1373.00 | 1364.17 | y = -176.59x + 1576.1 | 320mW | 1530.98 | 1522.16 | y = 176.59x + 1319.1 |
| 310mW | 1367.59 | 1356.87 | y = -214.28x + 1614 | 310mW | 1538.28 | 1527.56 | y = 214.28x + 1281.1 |
| 300mW | 1362.52 | 1350.12 | y = -247.95x + 1647.7 | 300mW | 1545.03 | 1532.63 | y = 247.95x + 1247.5 |
| 290mW | 1357.74 | 1343.81 | y = -278.56x + 1678.1 | 290mW | 1551.34 | 1537.41 | y = 278.56x + 1217.1 |
| 280mW | 1353.20 | 1337.86 | y = -306.76x + 1706 | 280mW | 1557.29 | 1541.95 | y = 306.76x + 1189.2 |
| 270mW | 1348.87 | 1332.22 | y = -333x + 1731.8 | 270mW | 1562.93 | 1546.28 | y = 333x + 1163.3 |
| 260mW | 1344.72 | 1326.84 | y = -357.62x + 1756 | 260mW | 1568.31 | 1550.43 | y = 357.62x + 1139.2 |
| 250mW | 1340.73 | 1321.69 | y = -380.86x + 1778.7 | 250mW | 1573.46 | 1554.42 | y = 380.86x + 1116.4 |
| 240mW | 1336.89 | 1316.74 | y = -402.93x + 1800.3 | 240mW | 1578.41 | 1558.26 | y = 402.93x + 1094.9 |
| 230mW | 1333.17 | 1311.98 | y = -423.96x + 1820.7 | 230mW | 1583.17 | 1561.98 | y = 423.96x + 1074.4 |

BARRIER COMPOSITION WAVELENGTH
□ 1.2 μm
○ 1.15 μm

| BARRIER COMPOSITION WAVELENGTH 1.2 μm | | BARRIER COMPOSITION WAVELENGTH 1.15 μm | |
|---|---|---|---|
| REFRACTIVE INDEX DIFFERENCE $\Delta n$ | MAXIMUM OPTICAL OUTPUT (mW) | REFRACTIVE INDEX DIFFERENCE $\Delta n$ | MAXIMUM OPTICAL OUTPUT (mW) |
| 0.016454 | 365.4 | 0.012705 | 385.2 |
| 0.015946 | 381.6 | 0.012437 | 386.5 |
| 0.015747 | 374.4 | 0.012168 | 386.7 |
| 0.015363 | 368.1 | 0.01201 | 379.5 |
| 0.01515 | 361.2 | 0.011885 | 378.1 |
| 0.014899 | 359.6 | 0.011761 | 377.1 |
| 0.014477 | 339.98 | 0.011456 | 369.3 |
| 0.014237 | 327 | 0.01104 | 340.6 |

FIG.11

| ‎ | ACTIVE LAYER WIDTH (um) | BARRIER COMPOSITION 1.2μm | | DETERMINATION | | BARRIER COMPOSITION 1.15μm | | DETERMINATION | |
|---|---|---|---|---|---|---|---|---|---|
| ‎ | ‎ | MAXIMUM OPTICAL OUTPUT Pmax | REFRACTIVE INDEX DIFFERENCE Δn | OPTICAL OUTPUT | KINK | MAXIMUM OPTICAL OUTPUT Pmax | REFRACTIVE INDEX DIFFERENCE Δn | OPTICAL OUTPUT | KINK |
| CONVENTIONAL ART | 1.2 | 152.1 | 0.01692 | Not Good | | 74.7 | 0.01123 | Not Good | |
| | 1.2 | 167.6 | 0.01670 | | | 75.8 | 0.01128 | | |
| | 1.2 | 149.2 | 0.01655 | | | | | | |
| | 1.5 | 173.6 | 0.01631 | | | 177.3 | 0.01127 | | |
| | 1.5 | 227.1 | 0.01572 | | | 139.4 | 0.01127 | | |
| | 1.8 | 277.4 | 0.01549 | | | 249.1 | 0.01217 | | |
| | 1.8 | 284.8 | 0.01551 | | | 258.3 | 0.01214 | | |
| | 1.8 | 283.1 | 0.01550 | | | 174 | 0.01226 | | |
| PRESENT INVENTION | 2.1 | 297.9 | 0.01540 | Very Good | | 283.9 | 0.01200 | Very Good | |
| | 2.1 | 301.8 | 0.01534 | | | 272.7 | 0.01205 | | |
| | 2.4 | 317.1 | 0.01531 | | | 327.8 | 0.01191 | | |
| | 2.4 | 319.7 | 0.01525 | | | 324 | 0.01192 | | |
| | 2.4 | 322.7 | 0.01527 | | | 310.6 | 0.01194 | | |
| | 2.7 | 357.1 | 0.01522 | | | 306.9 | 0.01182 | | |
| | 2.7 | 335.2 | 0.01522 | | | 336.2 | 0.01187 | | |
| | 2.7 | 349.7 | 0.01525 | | | 337.3 | 0.01186 | | |
| | 2.7 | 325.8 | 0.01523 | | | 321.3 | 0.01185 | | |
| | 2.7 | 330.3 | 0.01519 | | | 325.9 | 0.01188 | | |
| | 2.7 | 338.7 | 0.01522 | | | 329.9 | 0.01183 | | |
| | 2.7 | 336.1 | 0.01517 | | | 325.1 | 0.01183 | | |
| | 2.7 | | | | | 331.1 | 0.01183 | | |
| | 2.7 | | | | | 353.4 | 0.01181 | | |
| | 3 | 334.9 | 0.01517 | | | 339.5 | 0.01181 | | |
| | 3 | 350.2 | 0.01520 | | | 343.4 | 0.01185 | | |
| | 3 | 358.2 | 0.01522 | | | 343.1 | 0.01178 | | |
| | 3 | 339.9 | 0.01520 | | | 350.9 | 0.01183 | | |
| | 3 | 368 | 0.01520 | | | 362.8 | 0.01179 | | |
| | 3 | 354.7 | 0.01516 | | | 330.7 | 0.01182 | | |
| | 3 | | | | | 344.2 | 0.01180 | | |
| | 3 | | | | | 360.3 | 0.01180 | | |
| | 3 | | | | | 356.4 | 0.01178 | | |
| | 3.3 | 322.5 | 0.01521 | Good | | 354.1 | 0.01180 | Good | |
| | 3.3 | 324.1 | 0.01529 | | | 317.9 | 0.01180 | | |
| | 3.3 | 374.1 | 0.01519 | | | 351.8 | 0.01179 | | |
| | 3.3 | 358.6 | 0.01519 | | | 357.9 | 0.01180 | | |
| | 3.3 | 340 | 0.01520 | | | 361.4 | 0.01177 | | |
| | 3.3 | 358.4 | 0.01516 | | | 360.8 | 0.01178 | | |
| | 3.3 | 343.8 | 0.01515 | | | 358.8 | 0.01176 | | |
| | 3.3 | 385.3 | 0.01517 | | | 347.3 | 0.01174 | | |
| | 3.6 | 355.7 | 0.01515 | | | 370 | 0.01178 | | |
| | 3.6 | 354.5 | 0.01517 | | | 349.5 | 0.01179 | | |
| | 3.6 | 369.5 | 0.01517 | | | 354.1 | 0.01175 | | |
| | 3.6 | 375.7 | 0.01519 | | | 371.4 | 0.01177 | | |
| | 3.6 | 361.7 | 0.01516 | | | 362 | 0.01177 | | |
| | 3.6 | 387.9 | 0.01517 | | | 355.1 | 0.01177 | | |
| | 3.6 | 354.4 | 0.01515 | | | 388.9 | 0.01177 | | |
| | 3.6 | 356.1 | 0.01526 | | | 360.9 | 0.01175 | | |
| | 3.6 | | | | | 373.1 | 0.01173 | | |
| | 3.9 | 355.3 | 0.01544 | Good | | 382.5 | 0.01177 | | |
| | 3.9 | 349.1 | 0.01545 | | | 384 | 0.01178 | | |
| | 3.9 | 338.5 | 0.01533 | | | 365.1 | 0.01177 | | |
| | 3.9 | 311.7 | 0.01538 | | | 387.5 | 0.01177 | | |
| | 3.9 | 364.6 | 0.01514 | | | 349.6 | 0.01176 | | |
| | 3.9 | 332.8 | 0.01534 | | | 382.7 | 0.01176 | | |
| | 3.9 | 332.5 | 0.01523 | | | 377.7 | 0.01173 | | |
| | 3.9 | | | | | 365.4 | 0.01174 | | |
| | 3.9 | | | | | 364.9 | 0.01173 | | |
| | 4.2 | 362.1 | 0.01516 | | | 364.8 | 0.01176 | | Good |
| | 4.2 | 380.3 | 0.01516 | | | 380.6 | 0.01173 | | |
| | 4.5 | 387. | 0.01518 | | | 366.8 | 0.01192 | | |
| | 4.5 | 394.8 | 0.01526 | | | 375.9 | 0.01173 | | |
| | 4.8 | 382.1 | 0.01521 | | | 372.2 | 0.01182 | | |
| | 4.8 | 355.8 | 0.01532 | | | 385.9 | 0.01180 | | |
| | 4.8 | 405.3 | 0.01521 | | | 354.2 | 0.01175 | | |
| | 5.1 | 401.1 | 0.01517 | | | 375.6 | 0.01181 | | |
| | 5.1 | 391.6 | 0.01520 | | | 393.5 | 0.01182 | | |
| | 5.1 | | | | | 382 | 0.01182 | | |
| | 5.4 | 393.7 | 0.01520 | | | 395.9 | 0.01181 | | |
| | 5.4 | 415.5 | 0.01526 | | | 390.6 | 0.01182 | | |
| | 5.4 | 402.5 | 0.01520 | | | | | | |

FIG.12

| BARRIER COMPOSITION WAVELENGTH [μm] | LASING WAVELENGTH [nm] | REFRACTIVE INDEX DIFFERENCE Δn | ACTIVE LAYER WIDTH W [μm] |
|---|---|---|---|
| 1.2 | 1447.5 ± 37.5 | 0.01585 ± 0.00065 | 1.8 < W < 3.6 |
| 1.15 | 1392.5 ± 42.5 | 0.0124 ± 0.0006 | 1.8 < W < 4.2 |

SEMICONDUCTOR LASER DEVICE AND SEMICONDUCTOR LASER MODULE

BACKGROUND OF THE INVENTION

1) Field of the Invention

The present invention relates to a high output semiconductor laser and a high output semiconductor laser module used for an optical fiber amplifier such as an EDFA (Erbium-Doped Fiber Amplifier) or a Raman amplifier.

2) Description of the Related Art

In recent years, the rapid spread of the Internet and the sharp increase in intra-company, inter-LAN connections have caused the problem of an increase in data traffic to arise. To solve this problem, a WDM (Wave-length Division Multiplexing) transmission system is developed and spread dramatically.

In the WDM transmission system, a plurality of optical signals are carried on different wavelengths, respectively, thereby realizing large capacity transmission that is 100 times as large as the conventional system through even a line of fiber. Particularly, the existing WDM transmission system requires an optical fiber amplifier such as an erbium-doped fiber amplifier (hereinafter "EDFA") or a Raman amplifier. The use of such an optical fiber amplifier enables wide-band, long-distance transmission. The EDFA is an optical fiber amplifier that applies the principle that when a special fiber doped with an element of erbium is pumped by a pumping laser at a wavelength of 1480 nm or a wavelength of 980 nm, light in a band of a wavelength of 1550 nm, serving as a transmission signal, is amplified in the special fiber.

The Raman amplifier is a distribution type optical fiber amplifier that employs an ordinary transmission-path fiber as a gain medium without the need of the special fiber such as the erbium-doped fiber, unlike the EDFA. The Raman amplifier can realize a transmission band that has a flat gain in a wider band as compared to that of the conventional EDFA-based WDM transmission system.

Therefore, in order to realize an improvement in the reliability of the WDM transmissions system and a decrease in the number of relays thereof, a high output semiconductor pumping laser that operates stably in a single transverse mode is necessary for the optical fiber amplifier. As this pumping laser, a buried hetero-type semiconductor laser device (BH laser) is effective. The buried hetero-type semiconductor laser device includes an active layer having a quantum well structure, more preferably a multi-quantum well structure (MQW structure) in which the active layer consists of a plurality of quantum wells and baffler layers. Actually, a semiconductor laser module having such a semiconductor laser device packaged therein is employed as the pumping light source for the optical fiber amplifier.

There is known, as a technique for realizing the high output of the semiconductor laser device, one for forming an active layer to have a multi-quantum well (MQW) structure, particularly a strained MQW structure. The MQW structure is realized by forming heterojunctions between well layers and barrier layers alternately arranged and made of semiconductor materials. At each of the heterojunctions in particular, the barrier layer has wider bandgap energy than that of the well layer. Further, it is known that the strained MQW structure is a structure in which a semiconductor material of the well layer and a semiconductor substrate are different from each other in lattice constants, and that the strained MQW structure enables further improvement in performance of the semiconductor laser device.

The semiconductor laser device that has the active layer of the MQW structure often uses a separate confinement heterostructure (SCH) that functions as an optical waveguide in each of lower and upper portions adjacent to the active layer of the MQW structure. By using the SCH, it is possible to confine a laser beam generated in the active layer more efficiently, and to realize high output operation.

There is known a technique for enabling higher output of the laser by using a GRIN-SCH (Graded-Index-Separate Confinement Heterostructure) structure in the semiconductor laser device.

Meanwhile, it is known to adopt a long resonator structure as a unit for realizing far higher optical output in the semiconductor laser device. Making a resonator longer decreases both electric resistance and thermal impedance of the device, thus improving optical output saturation (heat saturation) caused by heat generation. This means an increase in not only the maximum optical output but also a driving current (saturation diving current) for saturation output (maximum optical output). Eventually, the semiconductor laser device that employs the long resonator can realize high output operation with low power consumption when the device is driven with a large current, as compared with the conventional semiconductor laser device. However, the semiconductor laser device that employs the long resonator has the following disadvantage. When a driving current is restricted to a certain degree, the influence of internal loss becomes dominantly larger as the resonator is longer. This results in the deterioration of external differential quantum efficiency and the lowering of optical output.

As another means for realizing high optical output, it is known to increase the width of the active layer of the semiconductor laser device. By widening the width of the active layer, it is possible to decrease both the electric resistance and thermal impedance of the semiconductor laser device, and to enable high output with a large current.

Therefore, it is the key to realizing higher output by increasing the width of the active layer as much as possible in the semiconductor laser device having the GRTN-SCH-MQW structure that includes a relatively long resonator. However, the active layer that includes the SCH also acts as an optical waveguide. Therefore, increase in the width of the active layer stimulates occurrence of a higher-order transverse mode. When the driving current of the laser increases a kink such that optical output becomes discontinuous at a certain driving current occurs more easily. In order to improve the stable operation of the semiconductor laser device and the manufacturing yield thereof, the occurrence of a kink should be avoided. Japanese Patent Application Laid-Open No. 8-330671, for example, discloses that the width of the active layer is required to be smaller than 1.8 $\mu$m so as to avoid the occurrence of the kink.

SUMMARY OF THE INVENTION

It is an object of the present invention to provide a semiconductor laser device and a semiconductor laser module capable of realizing stable high output by making the width of an active layer larger than that of a conventional active layer while suppressing occurrence of a high-order transverse mode.

The semiconductor laser device according to the present invention has a buried heterostructure, and comprises an active layer having at least one quantum well structure and a width of active region larger than 1.8 $\mu$m; and a plurality of current blocking layers arranged on both sides of the active layer, each of the current blocking layers being formed to contain at least InP; and a plurality of optical confinement layers each having a GRIN-SCH structure arranged on upper and lower sides of the active layer so as to sandwich the active layer. A refractive index difference between an equivalent refractive index in a region including the active layer and an equivalent refractive index in a region including the current blocking layers, is not more than 0.02.

The semiconductor laser device according to the present invention comprises an active layer having a quantum well structure including at least one barrier layer at a predetermined composition wavelength; and a plurality of optical confinement layers each having a GRIN-SCH structure arranged on upper and lower sides of the active layer so as to sandwich the active layer. The predetermined composition wavelength is determined based on a lasing wavelength band including a lasing wavelength that indicates a highest maximum optical output among maximum optical outputs at respective lasing wavelengths in a predetermined range of the lasing wavelengths.

The semiconductor laser device according to the present invention has a buried heterostructure, and comprises an active layer having at least one quantum well structure and a width of the active region larger than 1.8 $\mu$m; a plurality of current blocking layers arranged on both sides of the active layer, each of the current blocking layers being formed to contain at least InP; and a plurality of optical confinement layers each having a GRIN-SCH structure arranged on upper and lower sides of the active layer so as to sandwich the active layer. When a composition wavelength of a barrier layer constituting the quantum well structure is x1 $\mu$m and a lasing wavelength is y1 nm relationship of $-176.59x1+1576.1 \leq y1 \leq 176.59x1+1319.1$ is satisfied.

The semiconductor laser module according to the present invention comprises a semiconductor laser device having a buried hetero structure. The semiconductor laser device includes an active layer having at least one quantum well structure and a width of the active region larger than 1.8 $\mu$m; a plurality of current blocking layers arranged on both sides of the active layer, each of the current blocking layers being formed to contain at least InP; and a plurality of optical confinement layers each having a GRIN-SCH structure arranged on upper and lower sides of the active layer so as to sandwich the active layer, in which a refractive index difference between an equivalent refractive index in a region including the active layer and an equivalent refractive index in a region including the current blocking layers, is not more than 0.02. The semiconductor laser module further comprises an optical fiber that guides a laser beam emitted from the semiconductor laser device to an outside; and an optical coupling lens system that provides optical coupling between the semiconductor laser device and the optical fiber.

The semiconductor laser module according to the present invention, comprises a semiconductor laser device. The semiconductor laser device includes an active layer having a quantum well structure including at least one barrier layer at a predetermined composition wavelength; and a plurality of optical confinement layers each having a GRIN-SCH structure arranged on upper and lower sides of the active layer, in which the predetermined composition wavelength is determined based on a lasing wavelength band including a lasing wavelength that indicates a highest maximum optical output among maximum optical outputs at respective lasing wavelengths in a predetermined range of the lasing wavelengths. The semiconductor laser module further comprises an optical fiber that guides a laser beam emitted from the semiconductor laser device to an outside; and an optical coupling lens system that provides optical coupling between the semiconductor laser device and the optical fiber.

The semiconductor laser module according to the present invention, comprises a semiconductor laser device having a buried heterostructure. The semiconductor laser device includes an active layer having at least one quantum well structure and a width of the active region larger than 1.8 $\mu$m; a plurality of current blocking layers arranged on both sides of the active layer, each of the current blocking layers being formed to contain at least InP; and a plurality of optical confinement layers each having a GRIN-SCH structure arranged on upper and lower sides of the active layer, in which when a composition wavelength of a barrier layer constituting the quantum well structure is x1 $\mu$m and a lasing wavelength is y1 nm, a relationship of $-176.59x1+1576.1 \leq y1 \leq 176.59x1+1319.1$ is satisfied. The semiconductor laser module further comprises an optical fiber that guides a laser beam emitted from the semiconductor laser device to an outside; and an optical coupling lens system that provides optical coupling between the semiconductor laser device and the optical fiber.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 6 is a table that shows plot values and approximate expressions of the respective plots in the graph of FIG. 5;

FIG. 11 is a table that shows plot values of the graphs shown in FIGS. 10A and 10B and refractive index differences Δn corresponding to the respective plot values;

FIG. 12 is a table that shows the overall design parameters of the semiconductor laser device according to the first embodiment.

DETAILED DESCRIPTION

Embodiments of the semiconductor laser device and the semiconductor laser module according to the present invention are explained in detail below with reference to the drawings. It should be noted that the present invention is not limited by the embodiments.

A semiconductor laser device according to a first embodiment of the present invention is explained. The semiconductor laser device of the first embodiment is a BH-type semiconductor laser device that has the GRIN-SCH-MQW structure. In this embodiment, attention is paid to a correlation among a lasing wavelength, a composition of the barrier layer of the MQW structure, and a refractive index difference (Δn) between an equivalent refractive index of a region including an active layer and that of a region including a current blocking layer for the semiconductor laser device. By finding out an optimum combination of these three parameters, conditions that enable realization of high output operation without occurrence of a kink caused by a high-order transverse mode are considered. In this embodiment, a compressive strain multi-quantum well laser having GaInAsP-based material used on an n type InP substrate is explained by way of example.

Figure 1A:
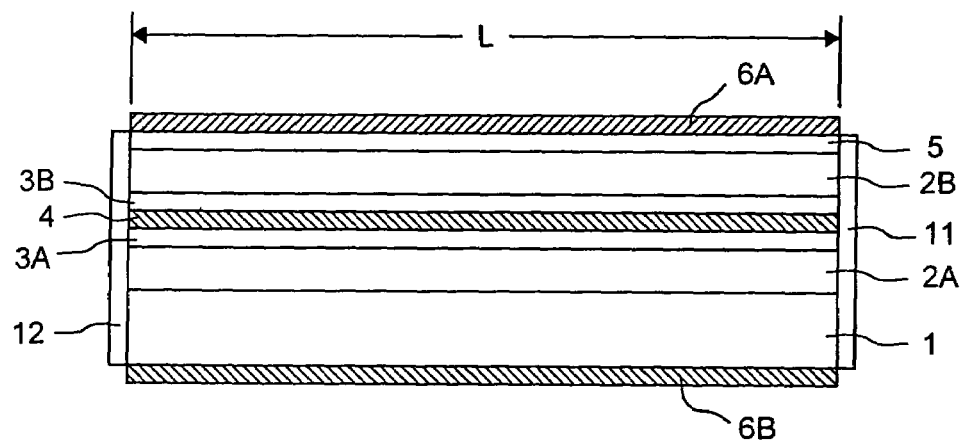
FIG. 1A is a sectional view of a semiconductor laser device according to a first embodiment of the present invention in a longitudinal direction.
Figure 1B:
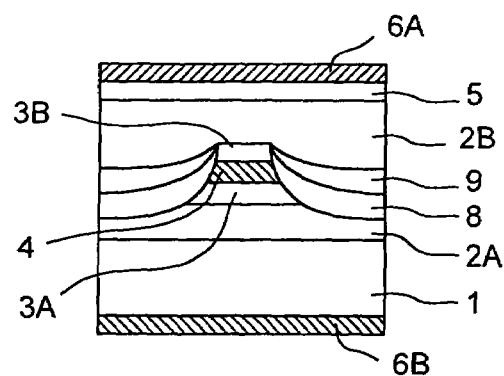
FIG. 1B is a sectional view of the semiconductor laser device according to the first embodiment in parallel to a light emission surface.

FIGS. 1A and 1B show sectional views of the semiconductor laser device of the first embodiment. FIG. 1A is a vertical sectional view of the semiconductor laser device in a longitudinal direction, and FIG. 1B is a sectional view thereof in parallel to a light emission surface. As shown in FIGS. 1A and 1B, the semiconductor laser device of the first embodiment is constituted so that an n type lower InP cladding layer 2A, an undoped lower optical confinement layer 3A, an active layer 4, an undoped upper optical confinement layer 3B, a p type upper InP cladding layer 2B, and a p type GaInAsP contact layer 5 are layered in this order on an n type InP semiconductor substrate 1. These layers are sequentially formed on the n type InP semiconductor substrate 1 by well-known epitaxial crystal growth technique such as MOCVD (Metal Organic Chemical Vapor Deposition) or MBE (Molecular Beam Epitaxy). In this embodiment, an example of forming elements using MOCVD is explained.

An n type lower electrode 6B is formed on the lower surface of the n type InP semiconductor substrate 1, and a p type upper electrode 6A is formed on the contact layer 5. A p type current blocking layer 8 and an n type current blocking layer 9 shown in FIG. 1B are formed in an adjacent region to a mesa structure (the lower optical confinement layer 3A, the active layer 4, and the upper optical confinement layer 3B) formed by a photolithographic technology and an etching process. The presence of the p type current blocking layer 8 and then type semiconductor layer 9 current blocking layer 9 enables the active layer 4 to act as a confinement region of an injection current, and realize a stable single transverse mode.

As shown in FIGS. 1A and 1B, in this semiconductor laser device, a length L of a resonator is specified by a front end surface that is a light emission surface and is formed by a cleavage plane and a rear end surface that is opposite to the front end surface and is formed by a cleavage plane. A low reflection film 11 is coated on the front end surface so as to facilitate light emission from the front surface of the resonator. A high reflection film 12 is coated on the rear end surface so as to suppress light emission from the rear surface of the resonator.

It is necessary to optimize the reflectance of the low reflection film 11 based on the resonator length L in order to realize an operation of the high output. The reflectance of the low reflection film 11 is, therefore, preferably not more than 5%, more preferably not more than 1.5%. In this embodiment, it is assumed that the resonator length L is 1300 $\mu$m, and the reflectance of the low reflection film 11 is 1.5%. When an external resonator such as a fiber Bragg grating is provided, the reflectance of the external resonator is preferably not more than 1%, more preferably not more than 0.1%. On the other hand, the reflectance of the high reflection film 12 is preferably not less than 90% for the optical output operation, and is set to 98% in this embodiment.

Figure 2:
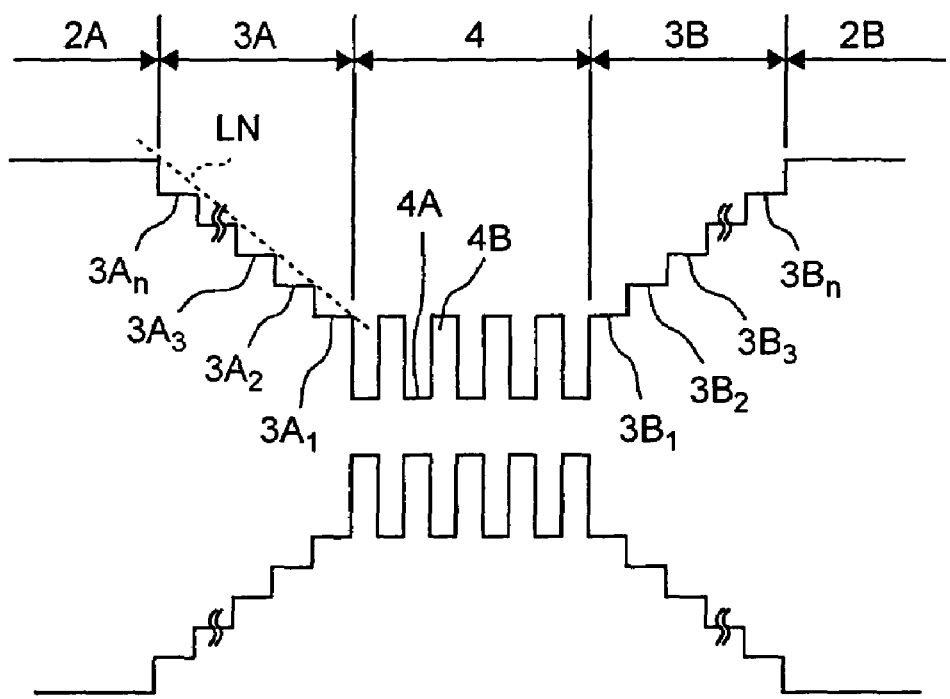
FIG. 2 shows a diagram of a bandgap between a conduction band and a valence band in the advantageously GRIN-SCH-MQW structure of the semiconductor laser device according to the first embodiment.

The active layer 4 in particular has the multi-quantum well (MQW) structure, and the optical confinement layers 3A and 3B arranged so as to sandwich the active layer 4 therebetween, have the GRIN-SCH structures. FIG. 2 is a bandgap diagram of a conduction band and a valence band in the GRIN-SCH-MQW structure of the semiconductor laser device in the first embodiment. As shown in FIG. 2, the active layer 4 is constituted so that well layers 4A and barrier layers 4B are alternately provided to form heterojunctions. FIG. 2 particularly shows a state in which the active layer 4 is formed to have the MQW structure that includes five wells. The optical confinement layers 3A and 3B located between the active layer 4 and the cladding layer 2A and the cladding layer 2B are formed to be symmetrical with respect to the active layer 4 not only in position but also thickness and composition. The optical confinement layers may be formed to be asymmetrical so that the lower optical confinement layer 3A is thicker than the upper optical confinement layer 3B.

As shown in FIG. 2, the optical confinement layers 3A and 3B have GRIN-SCH structures that have a plurality of layers $3A_1$, $3A_2$, ..., and $3A_n$, and $3B_1$, $3B_2$, ..., and $3B_n$, respectively in which the bandgap energies of the respective layers increases step by step as they are farther from the active layer 4. It is preferable that the respective optical confinement layers 3A and 3B have so-called linear GRIN-SCH structures. For example, as indicated by a line LN of FIG. 2, the optical confinement layer 3A is designed so that an envelope that connects the energy band edges of the layers $3A_1$, $3A_2$, ..., and $3A_n$ becomes linear. In this embodiment, with a view of reducing manufacturing cost and obtaining good crystals, the GRIN-SCH structures each of which consists of a relatively small number of layers, five or six layers, are employed.

The energy band relationship among the active layer 4, the optical confinement layers 3A and 3B, and the cladding layers 2A and 2B are as follows. The bandgap of the well layers in the active layer 4 (MQW structure) is the smallest, that of the barrier layers in the active layer 4 is the second smallest, that of the layers in the optical confinement layers 3A and 3B is the second largest, and that of the cladding layers 2A and 2B is the largest. The overall thickness of each of the optical confinement layers 3A and 3B is preferably 30 to 40 nm. The layers that constitute each of the optical confinement layers 3A and 3B can be made of, for example, InGaAsP materials that differ at least in composition.

In this embodiment, the active layer 4 has a strained multi-quantum well structure that consists of GaInAsP compression-strained quantum well layers each having a thickness of 4 nm and a strain amount of 1% and GaInAsP barrier layers each having a thickness of 10 nm. When the strain rate is not less than 0.5%, high output operation can be realized even when compression strain or tensile strain occurs. It is more preferable and advantageous for the high output operation that each well layer is a quantum well having a high strain rate of not less than 1.5%, and that each barrier layer has a strain compensation structure different in sign from the well layer so as to cause tensile strain to the barrier layer while causing the compression strain to the well layer.

Particularly, in this embodiment, as disclosed in Japanese Patent Application No. 2001-303732 filed by the same applicant as the applicant of the present application, an active layer region is doped with n type impurities at a concentration of $1\times10^{17}$ to $3\times10^{18}$ cm$^{-3}$. By doing so, the semiconductor laser device has a laser structure in which the electrical resistance and the thermal impedance Thereof can be decreased and high output operation with low power consumption can be realized even with a high injection current. As the n type impurities, sulfur (S), selenium (Se), or Si (silicon) impurities can be used. Alternatively, p type impurities such as zinc (Zn), beryllium (Be), or magnesium (Mg) impurities may be used in place of the n type impurities. As disclosed in Japanese Patent Application No. 2001-303732, the region doped with the impurities does not necessarily include all of pairs of the well layers and the adjacent baffler layers that constitute the multi-quantum well structure but may include a part of the pairs. Depending on desired optical output, the active layer may not be doped with impurities.

In this embodiment, a first semiconductor laser device and a second semiconductor laser device as explained below are manufactured as trial products so as to discover the correlation among the lasing wavelength, the barrier composition, and the active layer width. The first semiconductor laser device includes the active layer 4 having a barrier composition wavelength of 1.2 μm, and also includes the GaInAsP optical confinement layers 3A and 3B each having the GRIN-SCH structure that consists of layers having composition wavelengths of 0.95 μm, 1.0 μm, 1.05 μm, 1.1 μm, 1.15 μm, and 1.2 μm, respectively, and that has a layer thickness of 40 nm.

The second semiconductor laser device includes the active layer 4 having a barrier composition wavelength of 1.15 μm, and also includes the GaInAsP optical confinement layers 3A and 3B each having the GRIN-SCH structure that consists of layers having composition wavelengths of 0.95 μm, 1.0 μm, 1.05 μm, 1.1 μm and 1.15 μm, respectively, and that has a layer thickness of 32 nm. The active layer 4 of each of the first and second semiconductor laser devices consists of a GaInAsP layer having a width of 2.7 μm.

Figures 3A, 3B:
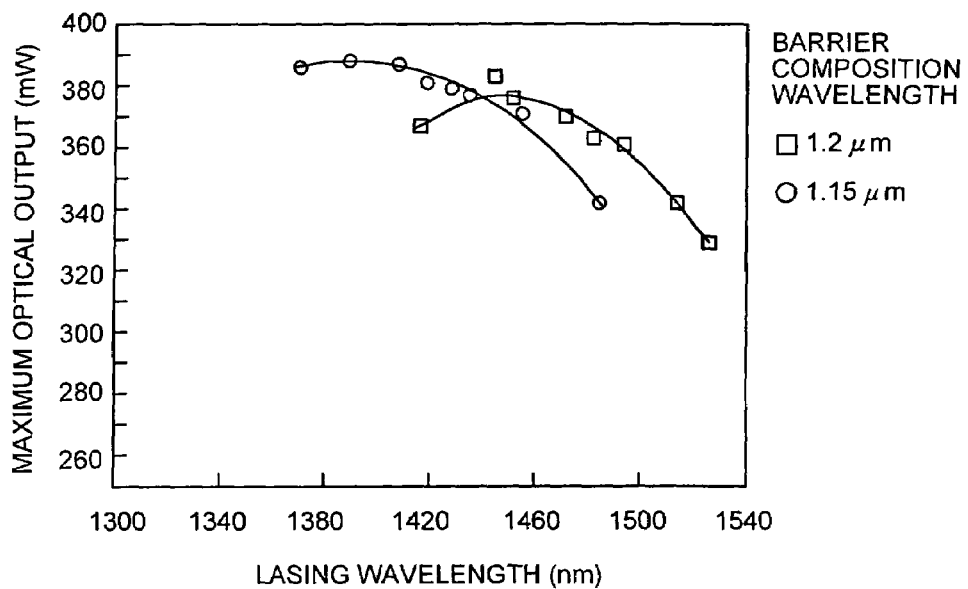
FIG. 3A is a graph that represents the lasing wavelength dependency of the semiconductor laser device according to the first embodiment.
FIG. 3B is a table that shows plot values of FIG. 3A.
Figure 4:
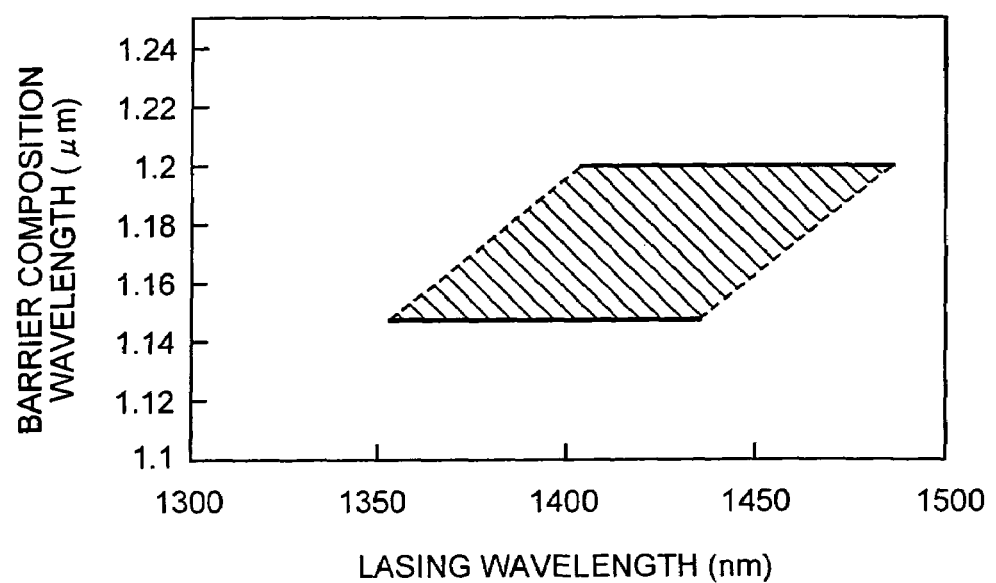
FIG. 4 is a graph that shows a relationship between a barrier composition wavelength and a lasing wavelength of the laser as an optical output in a predetermined range in the semiconductor laser device according to the first embodiment.

FIG. 3A is a graph that shows the lasing wavelength dependency of the semiconductor laser device according to the first embodiment. FIG. 3B is a table that shows plot values of FIG. 3A. FIGS. 3A and 3B in particular show the relationship between the lasing wavelength and the maximum optical output that changes according to a change in the composition ratio of the active layer 4. FIG. 4 shows the relationship between the barrier composition wavelength and the lasing wavelength as an optical output in a predetermined range. In FIG. 3A, square marks represent a plot for the first semiconductor laser device at a barrier composition wavelength of 1.2 μm, and circular marks represent a plot for the second semiconductor laser device at a barrier composition wavelength of 1.15 μm. In addition, the resonator length of the semiconductor laser devices employed to obtain these pieces of experimental data is 1300 μm, the reflectance of the low reflection film 11 is 1.5%, and the reflectance of the high reflectance film 12 is 98%.

As shown in FIG. 3A, for the first semiconductor laser device at a barrier composition wavelength of 1.2 μm, the maximum optical output is obtained at a lasing wavelength of 1450 nm, and the optical output tends to decrease before and after the maximum optical output. The reason is considered as follows. At wavelengths shorter than 1450 nm, an energy difference between the quantum well layers and the barrier layers becomes small. Therefore, when the device operates carrier injection, i.e., the device is driven with a large current, carriers are not sufficiently injected into the wells, and the influence of the overflow of the carriers appears. On the other hand, at wavelengths longer than 1450 nm, optical confinement becomes smaller, and therefore a waveguide loss increases.

Another possible reason is as follows. While the energy difference between the well layers and barrier layers increases, the increase makes it impossible to obtain interface steepness because of the crystal growth technique. As a result, non-radiative recombining component increases. Further, at wavelengths longer than 1500 nm, the influence of absorption caused by Auger recombination becomes conspicuous. As a result, it is considered to be more difficult to realize high output operation.

Eventually, FIG. 3A indicates the following matters. As for the first semiconductor laser device at the barrier composition wavelength of 1.2 μm, when the optimum range is set to a range from the maximum optical output to the level lower than the maximum optical output by 10 mW, the optical range corresponds to a lasing wavelength range of 1410 to 1485 nm. That is, there exists the optimum range of the lasing wavelength for the barrier composition wavelength of 1.2 μm. It is noted that this optimum range of the lasing wavelength is not necessarily set to the range as explained above and that the determination criteria for the optimum range can be changed according to optical output required when this semiconductor laser device is used as an optical fiber pumping light source, such as a range from the maximum optical output to a level lower than the maximum optical output by 20 mW or to a level lower by 5% or 10% of the maximum optical output.

On the other hand, for the second semiconductor laser device at a barrier composition wavelength of 1.15 μm, the higher power operation than that of the first semiconductor laser device at the barrier composition wavelength of 1.2 μm can be attained in a lasing wavelength region shorter than 1430 nm as shown in FIG. 3A. In particular, the laser device suitable for a Raman amplifier pumping light source that requires high output can be realized.

Particularly, when the optimum lasing wavelength range is set to a range from the maximum optical output to the level lower than the maximum optical output by 10 mW, the optimum range corresponds to a range of the lasing wavelength of 1350 to 1435 nm. As is explained later, the lower limit of the range can be obtained by plotting extrapolation values. In addition, the result shown in FIG. 3A indicates that since the equivalent output can be obtained regardless of whether the barrier composition wavelength is 1.2 μm or 1.15 μm at the lasing wavelength of 1430 nm, either structure can be adopted without causing any problems.

In the end, when the optimum range of the lasing wavelength is adopted in each of the first and second semiconductor laser devices, the semiconductor laser device that has the lasing wavelengths and barrier composition wavelengths corresponding to a shaded part as shown in FIG. 4 can realize stable high output.

Figure 5:
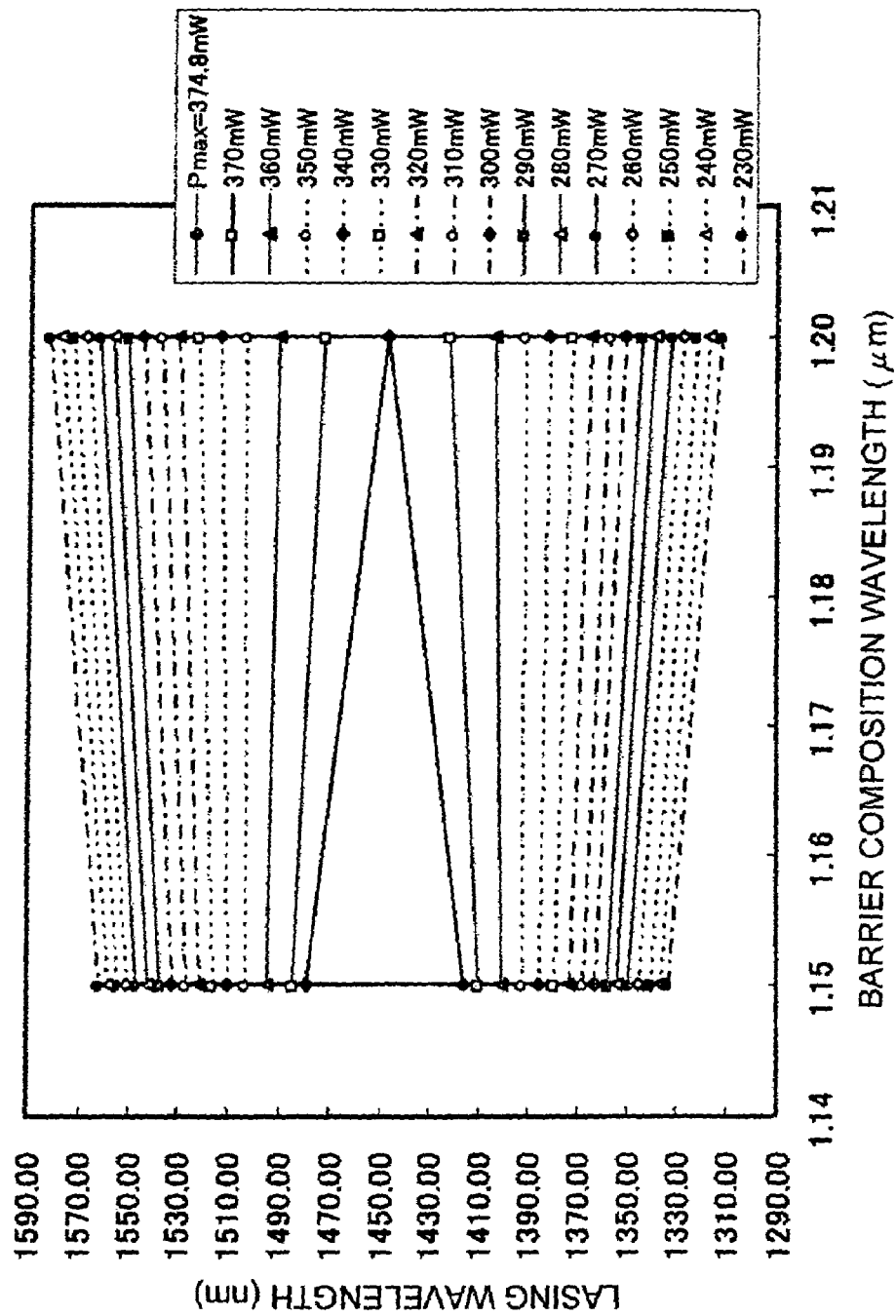
FIG. 5 is a graph that shows a relationship between a barrier composition wavelength and a lasing wavelength of the laser with respect to a certain maximum optical output in the semiconductor laser device according to the first embodiment.

FIG. 5 is a graph that shows the relationship between the barrier composition wavelength and the lasing wavelength for a certain maximum optical output. By using the relationship between the lasing wavelength and the maximum optical output shown in FIG. 3B, equations that represent the relationship are obtained for the barrier composition wavelengths of 1.2 μm and 1.15 μm, respectively. Using the obtained equations, lasing wavelengths for the maximum optical output that are not shown in FIGS. 3A and 3B are obtained as extrapolation and interpolation values. The following equation (1) is for the barrier composition wavelength of 1.2 μm, and the following equation (2) is for the barrier composition wavelength of 1.15 μm.

$$y = -7.87396 \times 10^{-3} \cdot x^2 + 2.27963 \times 10 \cdot x - 1.61249 \times 10^4 \quad (1)$$

$$y = -5.18417 \times 10^{-3} \cdot x^2 + 1.44220 \times 10 \cdot x - 9.64373 \times 10^3 \quad (2)$$

In FIG. 5, the horizontal axis indicates the barrier composition wavelength and the vertical axis indicates the lasing wavelength. FIG. 5 shows graphs for the maximum optical outputs from 230 mW to 370 mW at intervals of 10 mW and Pmax 374.8 mW corresponding to the maximum optical output at an intersection between the two curves shown in FIG. 3A.

FIG. 6 is a table that shows plot values of the respective graphs shown in FIG. 5 and approximate expressions thereof. From the approximate expressions shown in FIG. 6, the following expressions are established for an actually measured maximum optical output range of 20 mW to Pmax shown in FIG. 3A, for example:

$$-176.59x + 1576.1 \leq y \leq 176.59x + 1319.1$$

$$1.15 \leq x \leq 1.20$$

Where x indicates the barrier composition wavelength (μm) and y indicates the lasing wavelength (nm).

That is, the semiconductor laser device that satisfies at least these ranges as conditions can realize efficient and high output. In order to realize the semiconductor laser device having the maximum optical output of 370 mw or higher, for example, at a barrier composition wavelength of 1.2 μm, the semiconductor laser device outputs optical output in a composition wavelength range of 1422.9 to 1472.2 nm. At a barrier lasing wavelength of 1.15 μm, the device outputs optical output in a lasing wavelength range of 1410.4 to 1484.7 nm. While the optimum lasing wavelength range is determined based on the maximum optical output Pmax, the range may be determined based on conditions for maximizing the optical output at a constant driving current.

The difference between the equivalent refractive index of a region including the active layer 4 of the semiconductor laser device and that of a region including the current blocking layer is defined herein as a refractive index difference Δn, and the characteristic dependency of the refractive index difference Δn in the semiconductor laser device of this embodiment is explained below.

Figure 7:
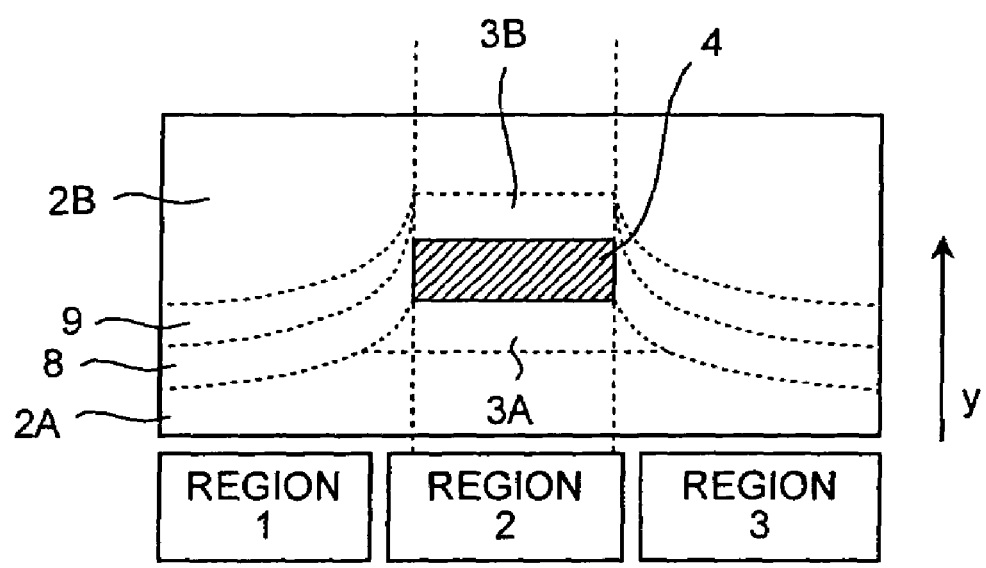
FIG. 7 is an explanatory view that explains a calculation model of a refractive index difference $\Delta n$.

FIG. 7 is an explanatory view that explains a calculation model for the refractive index difference Δn. FIG. 7 shows a part of the sectional view of the semiconductor laser device shown in FIG. 1B. As shown in FIG. 7, in this calculation model, the cladding layers 2A and 2B of the semiconductor laser device and the layers put between the cladding layers 2A and 2B thereof, are divided into a region 2 including the active layer 4 and regions 1 and 3 that do not include the active layer 4 (i.e., regions including the current blocking layer 8). An equivalent refractive index in the region 2 is obtained as a one-dimensional optical slab waveguide relative to a crystal growth direction (y direction in FIG. 7), and the difference between the refractive index in the region 2 and that in the region 1 or 3 is calculated as the refractive index difference Δn. In this embodiment, the refractive index difference Δn is calculated with the thickness of the cladding layers 3A and 3B set as 2 μm, respectively. It is noted that the refractive index used to obtain the equivalent refractive index is calculated according to the following equation based on MSEO (Modified Single Effective Oscillator) method.

$$n = \sqrt{1 + \frac{Ed(y)}{E0(y)} + \frac{Ed(y)}{E0(y)^3} \cdot E^2 + \frac{\eta}{\pi} \cdot E^4 \cdot \ln\left(\frac{2 \cdot E0(y)^2 - Eg(y)^2 - E^2}{Eg(y)^2 - E^2}\right)}$$

$$\eta = \frac{\pi \cdot Ed(y)}{2 \cdot E0(y)^3 \cdot (E0(y)^2 - Eg(y)^2)}$$

$$E0(y) = (3.391 - 1.652y) + 0.863y^2 - 0.123y^3$$

$$Ed(y) = 28.91 - 9.278y + 5.626y^2$$

$$Eg(y) = 1.35 - 0.72y + 0.12y^2$$

Where y indicates the composition of As in $Ga_xIn_{1-x}As_yP_{1-y}$, E indicates photon energy, and Eg(y) indicates the bandgap energy of GaInAsP. For example, the refractive index n of GaInAsP at a bandgap composition wavelength of 1.2 μm with respect to light at a wavelength of 1480 nm is 3.3534 and the refractive index n of InP is 3.1792 according to the above equation. Therefore, when the photon energy at a predetermined wavelength and the composition wavelength of a material are determined, a refractive index can be obtained from this equation.

Figures 8A, 8B:
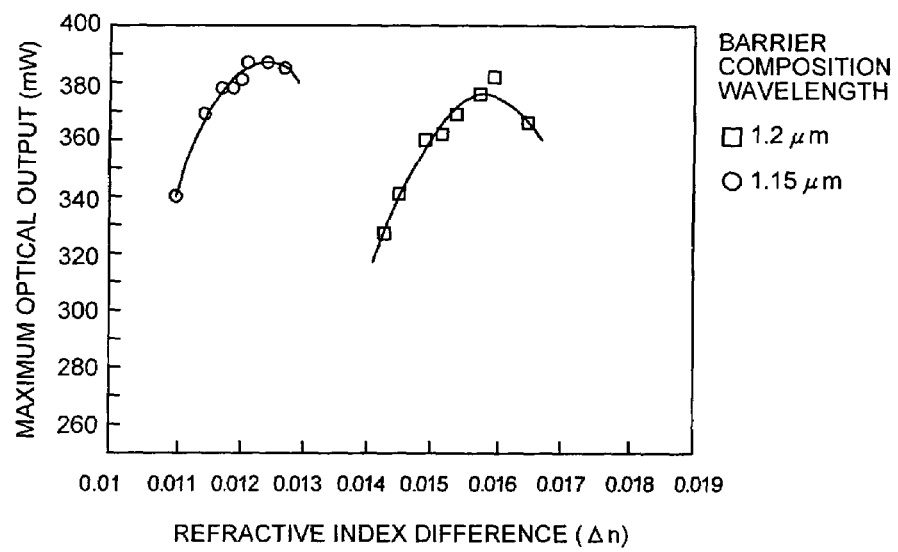
FIG. 8A is a graph that shows the refractive index difference dependency of the semiconductor laser device according to the first embodiment.
FIG. 8B is a table that shows plot values of the graph shown in FIG. 8A.
Figure 9:
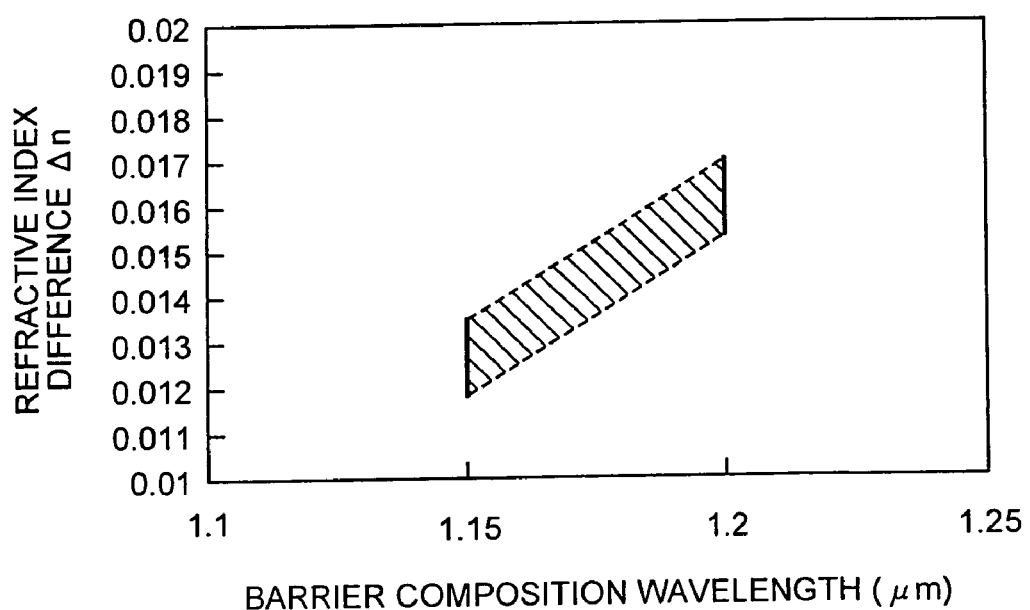
FIG. 9 is a graph that shows a relationship between the barrier composition wavelength and the refractive index difference $\Delta n$ of the semiconductor laser device according to the first embodiment.

FIG. 8A is a graph that shows the dependency of the semiconductor laser device in the first embodiment on the refractive index difference. FIG. 8B is a table that shows plot values of FIG. 8A. FIGS. 8A and 8B particularly show the relationship between the refractive index difference Δn and the maximum optical output. FIG. 9 shows the relationship between the barrier composition wavelength and the refractive index difference Δn. In FIG. 8A, square marks represent a plot for the first semiconductor laser device at a barrier composition wavelength of 1.2 μm, and circular marks represent a plot for the second semiconductor laser device at a barrier composition wavelength of 1.15 μm.

As shown in FIG. 8A, it can be seen that there exists an optimum value of the refractive index difference Δn for realizing the maximum optical output at a certain barrier composition wavelength. In the first semiconductor laser device at the barrier composition wavelength of 1.2 μm, the maximum optical output is shown at a refractive index difference Δn of 0.0158, while in the second semiconductor laser device at a barrier composition wavelength of 1.15 μm, the maximum optical output is shown at a refractive index difference Δn of 0.0125. Further, similarly to the above, when the optimum range of the refractive index difference Δn is set to a range from the maximum optical output to the level lower than the maximum optical output by 10 mW, the optimum range corresponds to a refractive index difference Δn range of 0.0152 to 0.0165 in the first semiconductor laser device at the barrier composition wavelength of 1.2 μm. The optimum range corresponds to a refractive index difference Δn range of 0.0118 to 0.0130 in the second semiconductor laser device at the barrier composition wavelength of 1.15 μm.

As already explained, this optimum refractive index difference Δn range is not necessarily set to the range as explained above, and the determination criteria for the optimum range can be changed according to optical output required when the first or second semiconductor laser device is used as an optical fiber pumping light source such as a range from the maximum optical output to the level lower than the maximum optical output by 20 mW or to the level lower by 5% or 10% of the maximum optical output.

Eventually, when each of the first and second semiconductor laser device adopts the optimum range of the refractive index difference Δn, it is possible to realize the stable high output of the semiconductor laser device that has a barrier composition wavelength and a refractive index difference Δn corresponding to a shaded part shown in FIG. 9.

The results shown in FIGS. 4 and 9 demonstrate that it is effective for high output operation to apply the barrier composition wavelength of a long wavelength composition in a long wavelength region and the barrier composition wavelength of a short wavelength composition in a short wavelength region.

Figure 10A:
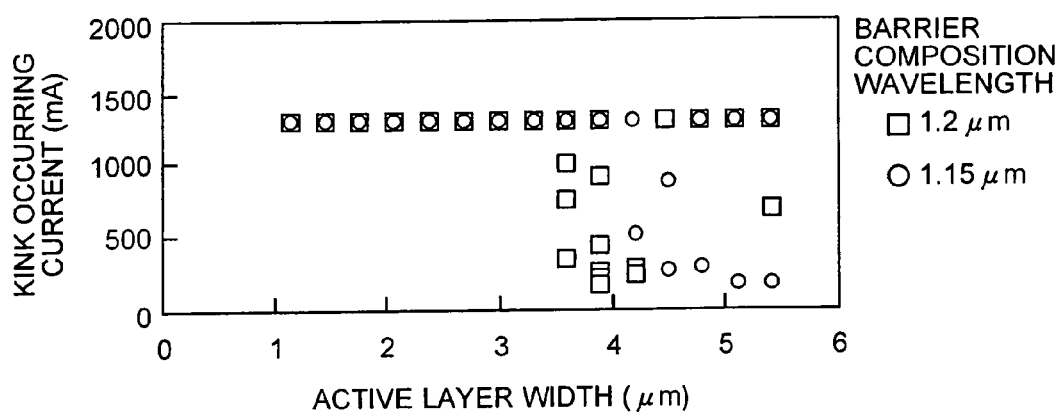
FIG. 10A is a graph that shows a relationship between an active layer width and a current at which a kink occurs.
Figure 10B:
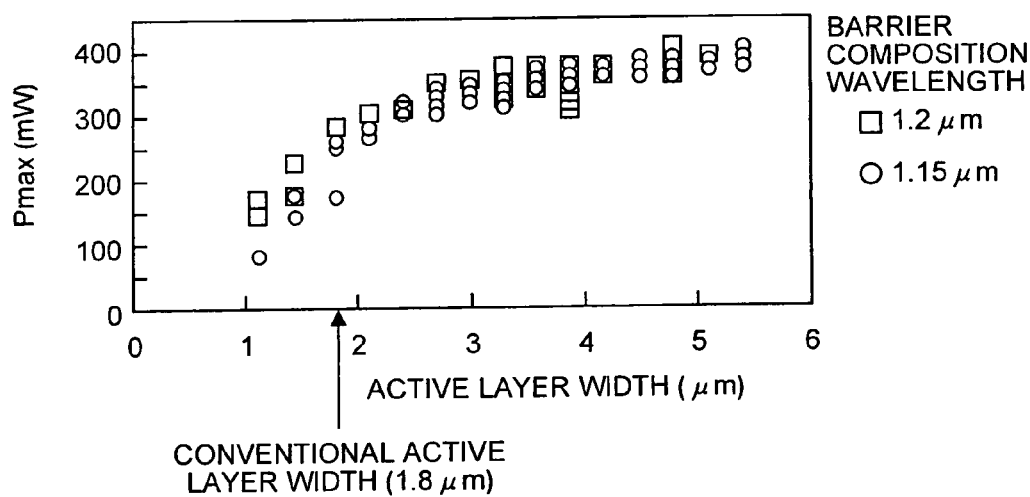
FIG. 10B is a graph that shows a relationship between the active layer width and the maximum optical output.

The dependency of the active layer width on a current at which a kink occurs due to a high-order transverse mode in the semiconductor laser device of this embodiment will next be explained. FIGS. 10A and 10B show graphs of the dependency of the active layer width of the semiconductor laser device according to the first embodiment. Particularly, FIG. 10A shows the relationship between the active layer width and the kink occurring current, and FIG. 10B shows the relationship between the active layer width and the maximum optical output. FIG. 11 is a table that shows plot values and refractive index differences An corresponding to the plot values of FIG. 10B, respectively. In FIGS. 10A and 10B, square marks represent a plot for the first semiconductor laser device at the barrier composition wavelength of 1.2 μm, and circular marks represent a plot for the second semiconductor laser device at the baffler composition wavelength of 1.15 μm. It is noted that there are different active layer widths as indicated by the horizontal axes shown in FIGS. 10A and 10B. The active layer width means herein an average of the width between the uppermost surface of the active layer and the lowermost surface of the active layer in the sectional view shown in FIG. 1B, or a width near the center therebetween. Further, the first semiconductor laser device is designed to have a lasing wavelength of 1480 nm, and the second semiconductor laser device is designed to have a lasing wavelength of 1435 nm.

As shown in FIG. 10A, in the first semiconductor laser device at the barrier composition wavelength of 1.2 μm, when the active layer width is not less than 3.6 μm, kink occurs caused by lasing the high-order transverse mode. In the second semiconductor laser device at the barrier composition wavelength of 1.15 μm, when the active layer width is not less than 4.2 μm, kink occurs caused by lasing the high-order transverse mode. The active layer where the kink due to the high-order transverse mode occurs is narrower in the first semiconductor laser device at the barrier composition wavelength of 1.2 μm. This is because the refractive index difference Δn of the first semiconductor laser device is larger than that of the second semiconductor laser device at the barrier composition wavelength of 1.15 μm and therefore cutoff of the high-order mode occurs at a narrower active layer. That is, in order to realize high output by increasing the active layer width, it is desirable to set the refractive index difference Δn as small as possible.

On the other hand, as shown in FIG. 10B, the maximum optical output tends to increase as the active layer width increases. Particularly in a range in which the high-order transverse mode does not occur, high output of a maximum of about 380 mW is achieved. As shown in FIG. 10B and FIG. 11, in particular, the semiconductor laser device having the conventional structure in which the active layer width is not more than 1.8 μm can realize only low optical output of not more than 300 mW at any barrier composition wavelength. In contrast to this, the semiconductor laser device of this embodiment can attain sufficiently high output and can suppress occurrence of the kink as well. The kink effect becomes conspicuous when the active layer width is not less than 3.6 μm at the barrier composition wavelength of 1.2 μm, and when the active layer width is not less than 4.2 μm at the barrier composition wavelength of 1.15 μm, as already explained above. Although these observation results influence manufacturing yield, they do not deny the possibility of highly efficient optical output. Therefore, as is obvious from the table shown in FIG. 11, the active layer width is preferably in a range of 2.1 to 5.4 μm, more preferably in a range of 3.0 to 5.4 μm, most preferably in a range of 4.0 to 5.4 μm in order to realize the highly efficient optical output.

FIG. 12 is a table that shows the overall results shown in FIGS. 3A to 11. It is obvious as shown in FIG. 12 that at least one semiconductor laser device and another semiconductor laser device that satisfy respective requirements as follows are optimum as stable high output pumping light sources that can suppress the occurrence of the high-order transverse mode. That is, the one semiconductor laser device satisfies the requirements of the barrier composition wavelength of 1.2 μm, the lasing wavelength of 1447.5±37.5 nm, the refractive index difference of 0.01585±0.00065, and the active layer width of 2.7±0.9 μm. The another semiconductor laser device satisfies the requirements of the barrier composition wavelength of 1.15 μm, the lasing wavelength of 1392.5±42.5 nm, the refractive index difference of 0.0124±0.0006, and the active layer width of 3.0±1.2 μm.

As explained so far, according to the semiconductor laser device of the first embodiment, the barrier composition wavelength and the active layer width are optimized according to the lasing wavelength band, whereby a high output semiconductor laser device suitable for the fiber amplifier pumping light source can be realized. Particularly, the increase in the active layer width is effective for the operation of the device with low power consumption following a decrease in the driving voltage. Further, the thermal impedance is also decreased, and therefore the temperature rise of the active layer is suppressed when the device is driven. This is also effective for the highly reliable operation of the semiconductor laser device. It is considered that the semiconductor laser device exhibits its advantages particularly in a wavelength band of not less than 1500 nm in which high output is difficult to attain.

In the first embodiment, the active layer 4 and the lower and upper optical confinement layers 3A and 3B are preferably made of InGaAsP while the substrate 1 is made of InP. However, the materials for these layers are not limited thereto, but various other materials may be used for the layers. For example, the layers may be made of AlGaInAsP or TlInGaAs while the substrate 1 is made of InP, or the layers may be made of AlGaInP, AlGaInNAsP, GaInNAsPSb, or GaInAsP while the substrate 1 is made of GaAs.

Further, in the first embodiment, the conductive type of the substrate 1 is n. Alternatively, the conductive type thereof may be changed to p and the conductive types of the respective layers on the substrate 1 may be changed accordingly.

If the active layer 4 includes at least one quantum well structure, the semiconductor laser device in the first embodiment can be applied to the semiconductor laser devices realized by providing various other layered structures. For example, the semiconductor laser device can be applied to a distributed feedback (DFB) laser, a distributed Bragg reflection (DBR) laser, a quantum wire laser, a quantum dot laser, a semiconductor laser that generates laser beams in a plurality of lasing longitudinal modes of not more than predetermined optical output, depending on the wavelength selectivity of a grating formed near the active layer, or the like. It is particularly suitable to apply the semiconductor laser device to a semiconductor laser with a resonator length of 800 $\mu$m to 3200 $\mu$m.

A semiconductor laser module according to a second embodiment is explained below. The semiconductor laser module of the second embodiment is obtained by sealing the semiconductor laser device explained in the first embodiment together with various optical components into a package. The semiconductor laser module is modularized so as to easily let a laser beam generated by the semiconductor laser device into an optical fiber.

Figure 13:
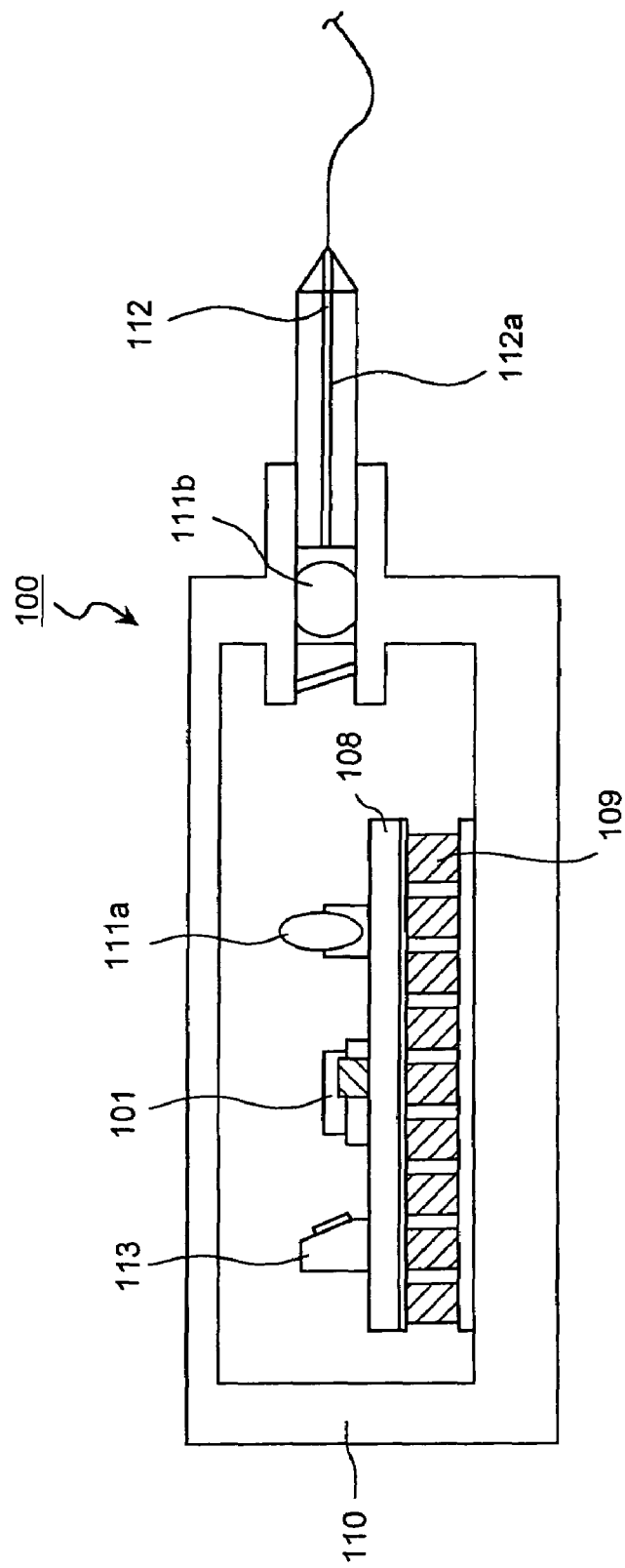
FIG. 13 is a vertical sectional view that shows the configuration of a semiconductor laser module according to a second embodiment of the present invention.

FIG. 13 is a vertical sectional view that shows the configuration of the semiconductor laser module of the second embodiment. In FIG. 13, the semiconductor laser module 100 is constituted so that a cooling device 109 composing of thermoelectric elements such as Peltier elements is arranged on the inner bottom of a package 110 made of ceramic or the like. On the cooling device 109, a base 108 is arranged. On this base 108, a semiconductor laser device 101 is arranged. This semiconductor laser device 101 corresponds to the semiconductor laser device explained in the first embodiment.

Further, in FIG. 13, an optical monitor photo-detector 113 and a first lens 111a besides the semiconductor laser device 101 are arranged on the base 108. As the active layer width is larger, the ellipticity of an emission beam (vertical-horizontal aspect ratio thereof) becomes higher. By optimizing the constituent lens, it is possible to realize higher coupling efficiency. In addition, a second lens 111b is arranged near a ferrule 112a into which an optical fiber 112 is filled.

A laser beam emitted from the semiconductor laser device 101 is coupled into the optical fiber 112 through the first lens 111a and the second lens 111b. In addition, the optical monitor photo-detector 113 monitors and detects light leaking from the rear end surface of the semiconductor laser device 101. Although not shown in FIG. 13, an isolator may be provided at a position between the first lens 111a and the second lens 111b, or a similar position.

As explained above, the semiconductor laser module according to the second embodiment is packaged so as to facilitate highly efficient optical coupling of the laser beam emitted from the semiconductor laser device explained in the first embodiment, to the optical fiber 112. Therefore, it is possible to easily utilize the semiconductor laser device of the first embodiment as the pumping light source of the optical fiber amplifier such as the EDFA or the Raman amplifier, and to realize the advantages such as the high output as explained in the first embodiment, in the optical fiber amplifier. In the second embodiment, the module that employs two lenses is disclosed. However, it is needless to say that even an LD module that employs one lens system or a lens fiber exhibits the same advantageous effect.

As explained so far, according to the semiconductor laser device of the present invention, for the active layer that includes at least one quantum well structure, it is possible to design to set the refractive index difference between the equivalent refractive index in the region including the active layer and that in the region including the current blocking layer, and to set the bandgap composition wavelength that indicates the barrier composition of the quantum well structure, to appropriate values so that the largest width of the active layer is obtained under the following conditions. That is, the conditions are those of preventing the occurrence of the high-order transverse mode, i.e., preventing the occurrence of kink due to the transverse mode. Therefore, it is advantageously possible to decrease the electric resistance and thermal impedance of the semiconductor laser device as compared to the conventional semiconductor laser device, and to eventually realize high output with low power consumption.

Further, according to the semiconductor laser module of the present invention, it is advantageously possible to seal the semiconductor laser device into a package and to provide the device as an optical fiber amplifier pumping light source in an optimum form.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser device, comprising:
    an active layer having at least one quantum well structure and a width of larger than 1.8 $\mu$m;
    a plurality of optical confinement layers each having a graded-index-separate confinement heterostructure (GRIN-SCH structure) formed on upper and lower sides of the active layer to sandwich the active layer between the optical confinement layers; and
    a plurality of current blocking layers formed on both lateral sides of the active layer and the plurality of optical confinement layers so as to sandwich the active layer and the plurality of optical confinement layers between the current blocking layers, each of the current blocking layers being formed by at least InP,
    wherein a refractive index difference between an equivalent refractive index in a region including the active layer and an equivalent refractive index in a region including the current blocking layers, is not more than 0.02.

2. The semiconductor laser device according to claim 1, wherein the active layer comprises a width determined by a lasing wavelength band including a lasing wavelength that indicates a highest maximum optical output among maximum optical outputs at lasing wavelengths in a predetermined range of lasing wavelengths, and by the refractive index difference corresponding to a neighborhood of the highest maximum optical output among the maximum optical outputs in refractive index differences in a predetermined range of refractive index differences.

3. The semiconductor laser device according to claim 1, wherein the refractive index difference is determined based on the quantum well structure comprising a barrier layer at a predetermined composition wavelength, and on structures of the optical confinement layers each having the GRIN-SCH structure, and the predetermined composition wavelength is determined based on a lasing wavelength band including a lasing wavelength that indicates a highest maximum optical output among maximum optical outputs at lasing wavelengths in a predetermined range of lasing wavelengths.

4. The semiconductor laser device according to claim 1, further comprising a plurality of cladding layers formed on upper and lower sides of the optical confinement layers so as to sandwich the optical confinement layers between the cladding layers, wherein bandgap energy increases from the active layer to the plurality of cladding layers.

5. The semiconductor laser device according to claim 1, further comprising a plurality of cladding layers formed on upper and lower sides of the optical confinement layers so as to sandwich the optical confinement layers between the cladding layers, wherein bandgap energy increases from the active layer to the plurality of cladding layers.

6. The semiconductor laser device according to claim 1, wherein each of the optical confinement layers has a thickness of 30 to 40 nm.

7. The semiconductor laser device according to claim 1, wherein each of the optical confinement layers is formed by InGaAsP.

8. The semiconductor laser device according to claim 1, wherein all of or a part of pairs each consisting of a well layer and an adjacent barrier layer that constitute the quantum well structure is doped with impurities.

9. A semiconductor laser device having a buried heterostructure, comprising:
   an active layer having at least one quantum well structure and a width of 2.1 to 5.4 $\mu$m;
   a plurality of optical confinement layers each having a graded-index-separate confinement heterostructure formed on upper and lower sides of the active layer so as to sandwich the active layer between the optical confinement layers; and
   a plurality of current blocking layers formed on both lateral sides of the active layer and the plurality of optical confinement layers so as to sandwich the active layer and the plurality of optical confinement layers between the current blocking layers, each of the current blocking layers being formed by at least InP,
   wherein a refractive index difference between an equivalent refractive index in a region including the active layer and an equivalent refractive index in a region including the current blocking layers, is not more than 0.02.

10. A semiconductor laser module comprising:
   a semiconductor laser device comprising:
      an active layer having at least one quantum well structure and a width of larger than 1.8 $\mu$m,
      a plurality of optical confinement layers each having a graded-index-separate confinement heterostructure formed on upper and lower sides of the active layer so as to sandwich the active layer between the optical confinement layers; and
      a plurality of current blocking layers formed on both lateral sides of the active layer and the plurality of optical confinement layers so as to sandwich the active layer and the plurality of optical confinement layers between the current blocking layers, each of the current blocking layers being formed by at least InP.
      wherein a refractive index difference between an equivalent refractive index in a region including the active layer and an equivalent refractive index in a region including the current blocking layers, is not more than 0.02;
   an optical fiber guiding a laser beam emitted from the semiconductor laser device to an outside; and
   an optical coupling lens system providing optical coupling between the semiconductor laser device and the optical fiber.

11. A semiconductor laser module comprising:
   a semiconductor laser device comprising:
      an active layer having at least one quantum well structure and a width of 2.1 to 5.4 $\mu$m,
      a plurality of optical confinement layers each having a graded-index-separate confinement heterostructure formed on upper and lower sides of the active layer to sandwich the active layer between the optical confinement layers; and
      a plurality of current blocking layers formed on both lateral sides of the active layer and the plurality of optical confinement layers so as to sandwich the active layer and the plurality of optical confinement layers between the current blocking layers, each of the current blocking layers being formed by at least InP,
      wherein a refractive index difference between an equivalent refractive index in a region including the active layer and an equivalent refractive index in a region including the current blocking layers, is not more than 0.02;
   an optical fiber guiding a laser beam emitted from the semiconductor laser device to an outside; and
   an optical coupling lens system providing optical coupling between the semiconductor laser device and the optical fiber.

* * * * *